United States Patent [19]
Huggins

[11] Patent Number: 5,237,391
[45] Date of Patent: Aug. 17, 1993

[54] MULTITRACK MULTILEVEL SENSING SYSTEM

[75] Inventor: Raymond W. Huggins, Mercer Island, Wash.

[73] Assignee: The Boeing Company, Seattle, Wash.

[21] Appl. No.: 575,588

[22] Filed: Aug. 31, 1990

Related U.S. Application Data

[63] Continuation-in-part of Ser. No. 275,208, Nov. 23, 1988, Pat. No. 4,964,727.

[51] Int. Cl.$^5$ .................... G01B 11/14; H01J 3/14
[52] U.S. Cl. .................... 356/373; 356/374; 250/237 G; 33/707
[58] Field of Search ............ 356/373, 374; 250/226, 250/237 G, 231.18, 231.16, 231.14; 33/706, 707, 746; 364/739, 746, 561; 235/437, 430

[56] References Cited

U.S. PATENT DOCUMENTS

| | | | |
|---|---|---|---|
| 4,047,025 | 9/1977 | lemelson | 250/237 G |
| 4,223,216 | 9/1980 | Quick et al. | 250/226 |
| 4,334,152 | 6/1982 | Dakin et al. | 250/226 |
| 4,465,373 | 8/1984 | Amaki et al. | 250/237 G |
| 4,740,688 | 4/1988 | Edwards | 250/226 |
| 4,816,672 | 3/1989 | Hughes | 250/231 |
| 4,849,624 | 7/1989 | Huggins | 250/226 |
| 4,964,727 | 10/1990 | Huggins | 356/373 |
| 4,999,489 | 3/1991 | Huggins | 250/226 |

OTHER PUBLICATIONS

K. Fritsch and G. Beheim, "Wavelength-Division Multiplexed Digital Optical Position Transducer," *Optics Letters*, Jan. 1986, 3 pages.

Norris Lewis, "Fiber Optic Sensors Offer Advantages for Aircraft," *SPIE Optical Engineering Reports*, Jun. 1987, 2 pages.

Primary Examiner—Richard A. Rosenberger
Assistant Examiner—Hoa Pham
Attorney, Agent, or Firm—Christensen, O'Connor Johnson & Kindness

[57] ABSTRACT

An optical sensor in which both analog and digital techniques are employed. The sensor comprises an encoder and a detector. The encoder includes a plurality of tracks extending along a sensing axis. Each track has a property that varies along the sensing axis, such that the property can have one of three or more distinguishable levels. The detector detects the levels of the tracks at a position along the sensing axis, and produces corresponding output signals. The levels vary in a manner such that the output signals encode the position of the encoder with respect to the detector. The levels may vary in steps or continuously. For stepwise variable tracks, preferably only one track changes its level at any given position, and all changes in level occur in single steps. Both optical and electrical implementations are described.

14 Claims, 9 Drawing Sheets

MULTITRACK MULTILEVEL SENSING SYSTEM

RELATED APPLICATIONS

This application is a continuation-in-part of U.S. patent application Ser. No. 07/275,208, filed Nov. 23, 1988 now U.S. Pat. No. 4,964,727.

FIELD OF THE INVENTION

The present invention relates to sensing systems, and in particular to a sensing system that operates by sensing the position of a multitrack encoder.

BACKGROUND OF THE INVENTION

A number of attempts have been made to design and fabricate high precision sensing systems. In one known type of system, an encoder is attached to a movable member, and the position of the member is determined by interrogating the encoder with an optical or electrical signal. The member may be one that rotates, in which case the encoder may comprise a disk that rotates with the member, or may be linearly movable, in which case the encoder moves linearly along with the member.

In an analog system, the encoder typically includes a track that has a continuously variable property, such as a continuously variable optical transmission or reflection coefficient, or a continuously variable electrical resistance. In one known optical arrangement, an optical signal is transmitted to the encoder by an optical fiber, passes through the variable density track, and is then transmitted back to a suitable detector by an optical fiber. The optical attenuation of the fiber-optic links is an unknown and variable factor that must be determined before the position of the encoder can be inferred solely from an end-to-end attenuation measurement. In a so-called two-wavelength referenced system, the link attenuation is measured by transmitting two optical signals having different wavelengths, and by designing the sensor such that only one signal is attenuated as a function of the encoder position. Attempts have been made to fabricate systems of this type that are capable of high-precision. However, it has been found that the performance is limited by differential bending loss with wavelength in the optical fibers, and differential loss due to different mode structures caused by different signal launching conditions. The stability of two wavelength referenced systems is generally accepted to be about 1 percent.

In prior digital encoding systems, the encoder includes a number of parallel coded tracks, each of which represents a specific bit in a binary word. Each track comprises a series of elements or positions, each of which has a property that can assume one of two states, such as transmitting/nontransmitting or reflecting/nonreflecting in optical systems, or conducting/nonconducting or high voltage/low voltage in electrical systems. For each position of the digital encoder, the tracks will present a different combination of elements, and therefore a different binary word, to the detection system. The precision is limited only by the highest achievable element density of the least significant track. In an optical system, wavelength division multiplexing (WDM) may be used to interrogate each track with light in a different wavelength range. This arrangement permits optical signals to be coupled to and from the sensor along single fiber-optic cables.

WDM digital encoding systems have been described that use a combination of a GRIN rod lens, a prism, and a diffraction grating. Such a system is optically complicated and inefficient, and requires a broad band source for operation. A fundamental problem, common to all WDM encoders that use a diffraction grating as the dispersive element, is that a reasonably well-collimated beam is required if reasonable resolution and channel width are to be obtained. In particular, one dimension of the beam should be no wider than the dimensions of the elements of the least significant track along the length of the track. This limits the resolution to the fiber core diameter. Smaller diameter fibers mean that less light can be launched into the fiber, thereby reducing the signal-to-noise ratio. A compromise must therefore be made between resolution, optical efficiency, system losses, and the physical size of the sensor. Similar considerations apply to the use of interference filters to demultiplex the channels.

SUMMARY OF THE INVENTION

The analog and WDM digital encoding systems discussed above represent the state-of-the-art, and unfortunately fall short of many performance requirements, particularly with respect to size and precision. The present invention provides a novel sensor and sensing (e.g., encoding) system in which both analog and digital techniques are employed, to produce a significant increase in accuracy for a given sensor size.

The sensor of the present invention generally comprises encoding means and detection means. The encoding means is typically connected to a movable member (e.g., a shaft) whose position is to be sensed, and includes a sensing axis and a plurality of tracks extending along the sensing axis. Each track has a property that varies along the sensing axis such that the property can have one of three or more distinguishable levels. The detection means includes means for detecting the levels of the tracks at a position along the sensing axis, and for producing output signals corresponding to such levels at such position. The levels vary in a manner such that the output signals encode the position of the encoder with respect to the detection means along the sensing axis.

The levels of the tracks may vary in either a stepwise or continuous manner along the sensing axis. A preferred embodiment includes a plurality of tracks having stepwise variations, and a least significant track along which the level varies continuously. For the stepwise variable tracks, preferably only one track changes its level at any given position along the sensing axis, and all changes in level occur in single steps. Both optical and electrical implementations of the invention are described.

BRIEF DESCRIPTION OF THE DRAWINGS

FIG. 2 illustrates one method of encoding a series of values with three tracks and four levels;

FIG. 3 illustrates a second technique for encoding the series of values;

DETAILED DESCRIPTION OF A PREFERRED EMBODIMENT

Figure 1:
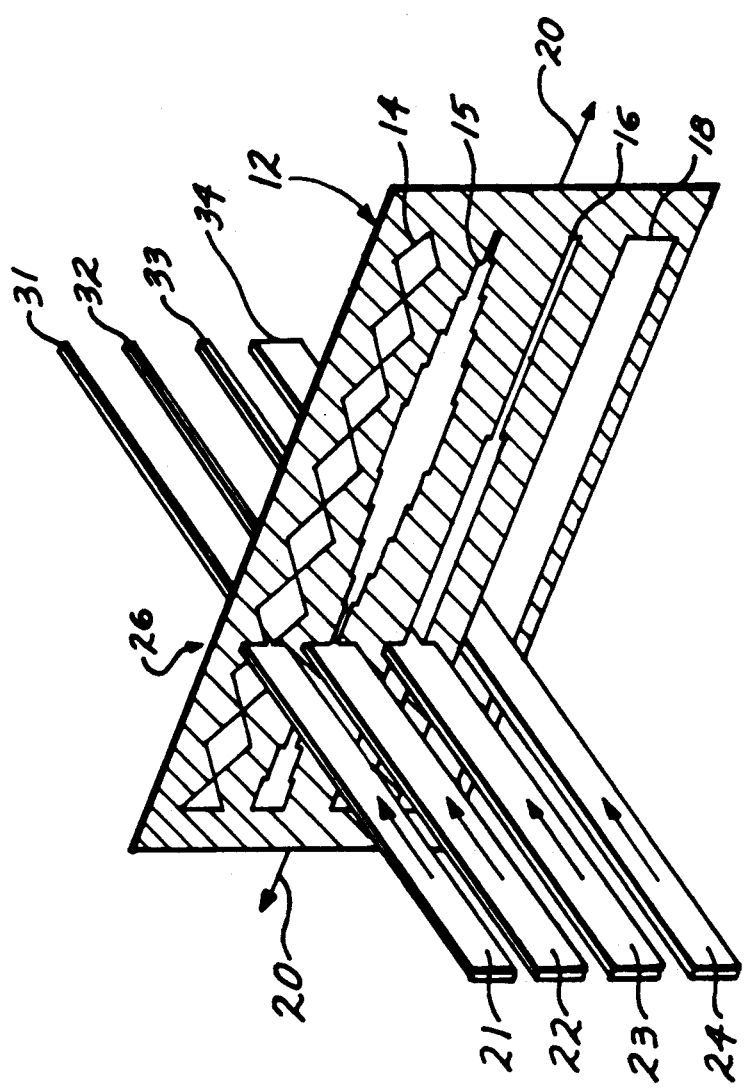
FIG. 1 is a schematic diagram showing an optical encoder according to the present invention.

The sensing technique of the present invention is illustrated in schematic form for an optical system in FIG. 1. In the illustrated example, encoder 12 includes three data-carrying tracks 14, 15 and 16 (hereafter "data tracks"), and a reference track 18, all extending parallel to sensing axis 20. A transmissive system is shown in which encoder 12 is opaque, and the tracks comprise transparent or open areas that extend parallel to the sensing axis. The tracks are interrogated by beams 21-24 that strike the encoder at detection position 26, and the sensing system is arranged such that encoder 12 moves along sensing axis 20 relative to beams 21-24, in response to the movement of some member, or the variation of some measurand. Although in FIG. 1 the tracks and the sensing axis are linear, rotational encoders can also be used in which the tracks and sensing axis are circular.

The position of the encoder along axis 20 is determined by interrogating the encoder with optical input beams 21-24. Each input beam strikes one of the tracks, and in the illustrated embodiment has a bar-shaped cross section that extends across the width dimension of the track. The amount of optical energy that passes through each track is a function of a width of that track at detection position 26, i.e., at the current position of encoder 12 with respect to beams 21-24 along axis 20. As a result, the optical energies of the three modulated beams 31-33 that emerge from the opposite side of encoder 12 contain information that may be processed to determine the current relative position of the encoder with respect to the beams. The fourth beam 34 is not modulated by encoder position, and serves as a reference. Alternately, the tracks could have reflective coatings, in which case the modulated beams would be produced by reflection from the tracks, and would be formed on the same side of the encoder as the input beams.

An important distinguishing feature of the present invention is that the invention utilizes two or more data tracks, as in prior digital encoding systems, in combination with three or more levels per track, as in prior analog encoding systems. This combination of digital and analog techniques produces an encoding system that is capable of achieving higher accuracy for a given encoder size and complexity, while requiring only moderate analog stability compared to single track analog systems.

Figures 2, 3:
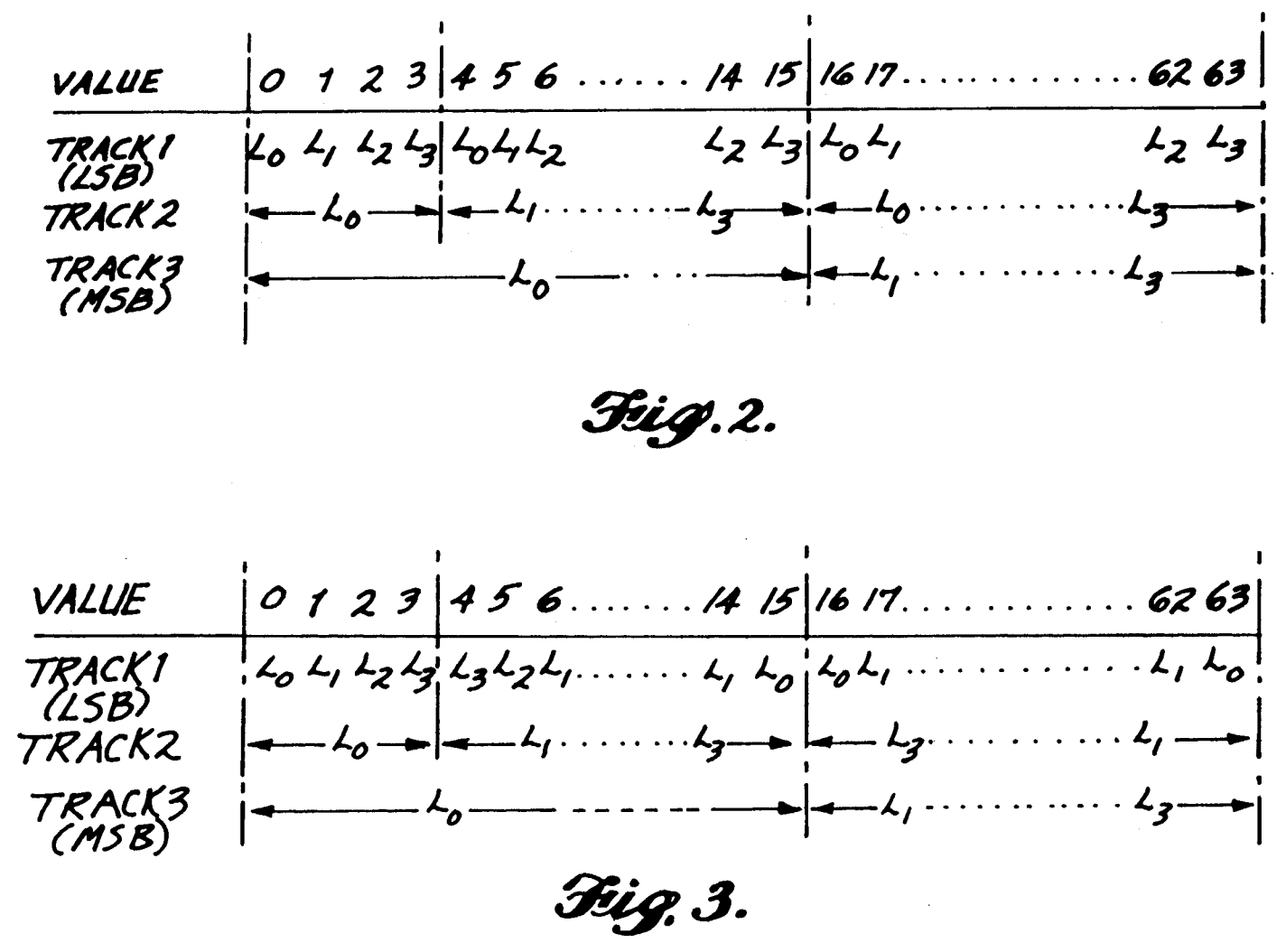

FIGS. 2 and 3 illustrate two techniques for using the variable transmission, reflection, or other property of the tracks to encode numeric values according to the present invention. In a system that includes M data tracks (M>1), and in which the variable property of the tracks can take on N different distinguishable levels $L_0$ through $L_{N-1}$ (N>2), the maximum number of values that can be encoded is $N^M$. Thus for the illustrated embodiment that includes three tracks (M=3), each track position having one of four different levels $L_0$, $L_1$, $L_2$ or $L_3$ (N=4), values from zero through 63 may be encoded. As described in further detail below, a track may have a set of N discrete levels, or a continuously varying level. In the latter case, the conversion of the continuously varying level into one of N discrete levels may be effected by first converting the optical modulated signal into a corresponding continuously varying electrical signal, and then introducing the continuously varying electrical signal into a suitable level detection circuit.

In the encoding technique shown in FIG. 2, track 1 is assumed to represent the least significant bit (LSB), and track 3 is assumed to represent the most significant bit (MSB). As illustrated, in encoding the sequence of values from 0-63, all three tracks begin at level $L_0$, corresponding to a value of zero. Track 1 then runs through its four levels while tracks 2 and 3 remain at constant levels, whereupon track 2 changes to level $L_1$, and track 1 again runs through its four levels, etc. When tracks 1 and 2 have both reached level $L_3$, e.g., at the value 15, then track 3 changes to its next level, and the process again repeats until at value 63, all three tracks are at level $L_3$.

A limitation of the encoder design shown in FIG. 2 can be seen by considering the transition between the values 15 and 16. At this transition, tracks 1 and 2 both change from the highest level $L_3$ to the lowest level $L_0$, and track 3 changes from level $L_0$ to level $L_1$. Because of slight imperfections in the sensor, these transitions will not be simultaneous, and the indicated position of the encoder will be incorrect during the transitions. Also, during the transition from level $L_3$ to level $L_0$, levels $L_2$ and $L_1$ will be detected for tracks 1 and 2, leading to further erroneous position indications. These problems are substantially eliminated by the preferred embodiment illustrated in FIG. 3. In the FIG. 3 arrangement, after a first track has run through its sequence of levels from $L_0$ through $L_3$, the next most significant track changes levels, and the first track then runs through the sequence in reverse order, from $L_3$ to $L_0$. This ensures two things. First, when a transition occurs in a given track, all other tracks remain the same at that transition, and thus only a single track changes its level at any given position along the sensing axis. Second, for all tracks, all transitions are ± one level, to thereby eliminate the possibility of reading an erroneous intermediate level at a transition. In the arrangement shown in FIG. 3, the track 1 pattern is "reflected" about the transition between values 3 and 4, 7 and 8, etc., and the track 2 pattern is reflected about the transition between values 15 and 16, 31 and 32, etc. Tracks 1 and 2 can therefore be described as palindromic, i.e., they read the same in both the forward and reverse directions.

Figure 4:
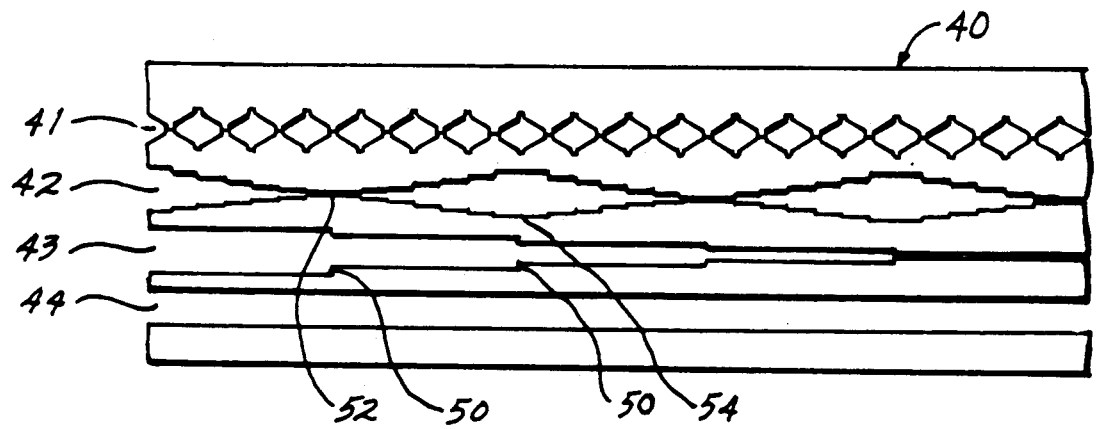
FIG. 4 is a plan view of a portion of a preferred embodiment of an optical encoder according to the present invention.
Figure 5:
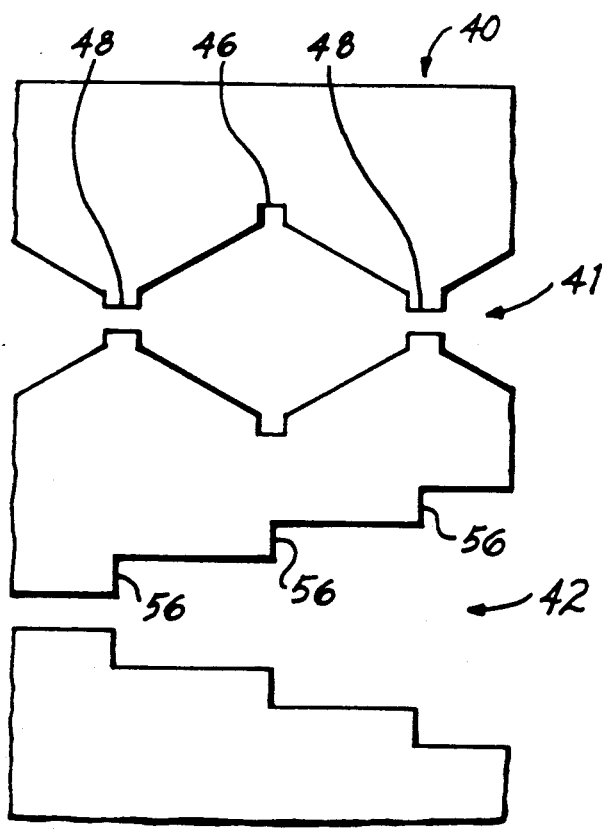
FIG. 5 is an enlarged view of a portion of the encoder of FIG. 4.

FIGS. 4 and 5 illustrate a particular preferred embodiment for the shapes of the tracks for a three data track optical system similar to that shown in FIG. 1. In particular, FIG. 4 illustrates encoder 40 having three data tracks 41-43, with track 41 being the least significant track and track 43 being the most significant track. FIG. 4 also illustrates reference track 44 that has a constant level (i.e., width). A reflected, palindromic weighted number system is used, similar to that shown in FIG. 3. In the least significant track 41, the level changes continuously, rather than in discrete steps, as shown in more detail in FIG. 5. Track 41 is palindromic, and is reflected about maximum transmission points 46, and minimum transmission points 48. Track 41 is shaped so as to have an enhanced level at the maximum transmission points 46 and a reduced level at the minimum transmission points 48, to minimize the potential for error at these positions.

FIGS. 4 and 5 illustrate the important preferred feature that for tracks having stepwise variations in value, the changes between different values occur in single steps, and at positions along the sensing axis at which all other tracks have a constant value. In particular, steps 50 in track 43 occur when the width of track 42 is either a minimum, such as at position 52, or a maximum, such as at position 54, and when track 41 is either at a minimum or maximum transition point. Similarly, as shown in FIG. 5, steps 56 in track 42 occur either at maximum transmission points 46 or minimum transmission points 48 of track 41.

Tracks having three or more levels can be created in a number of ways. For example, in an optical transmission system, the energy of a modulated beam can be changed by varying the width of the track, as shown in FIG. 1, and/or by varying the optical density or transmissivity of the track. Variable transmissivity can be created by means of an optical film having variable density, or by means of a pattern of opaque elements in which the density or size of the elements varies. As already mentioned, level variation can either occur in discrete steps, as illustrated by track 42 of FIG. 5, or continuously, as illustrated by track 41 in FIG. 5. In a track with a continuously varying level, the discrimination in discrete levels occurs in the electronics, as further described below. As a result, increased resolution is possible, because the resolution is not limited by the width of the interrogating beams along the sensing axis. In a system that is operated by reflection rather than by transmission, the energy of the modulated beam can be varied by varying the width of a reflective track, or by varying the reflectivity of the track. Varying track reflectivity could be created by varying the density or size of reflective elements, as for the transmission case.

The stability or precision of the analog measurement need only be better than 1/N, where N (the number of levels) will typically be between 4 and 20. A stability of one part in 20 (5%) is about 5 times easier to obtain than the accepted state-of-the-art for analog systems. Such performance can be achieved without going to an excessive degree of optical complexity, and without adopting overly complex signal processing methods. Further, the more significant tracks can have fewer levels, thus further reducing the performance requirements of the level discrimination system. For example, a weighted three-track system with 16, 8 and 4 levels for the least, middle and most significant tracks respectively gives a resolution of 1 in 512, or 9 bits. In addition, for tracks that vary in stepwise fashion, the step sizes do not need to be constant. For example, for an encoder such as shown in FIGS. 4 and 5, a preferred approach is to make the relative step size, i.e., the step size divided by the width of the track at that point, substantially constant.

Figure 6:
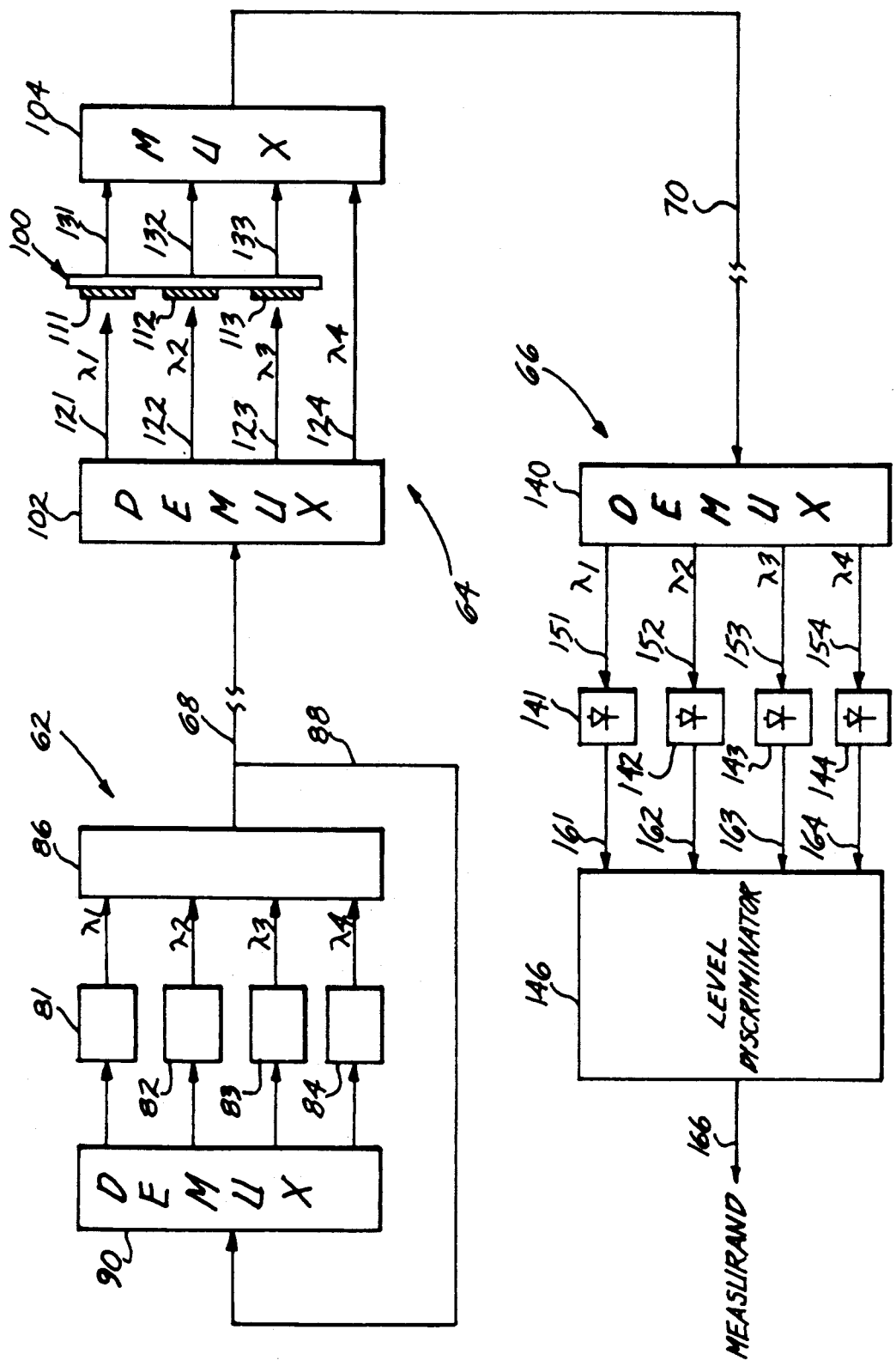
FIG. 6 is a schematic diagram of an optical sensing system including the sensor of the present invention.

One preferred embodiment of an optical sensing system according to the present invention is illustrated in schematic form in FIG. 6. The sensing system comprises source 62, sensor 64, and detector 66. The source is coupled to sensor 64 by fiber-optic cable 68, and the detector is coupled to sensor 64 by fiber-optic cable 70. The sensor can therefore be located at a position remote from the source and detector.

Source 62 comprises optical emitters 81–84 that produce light in four different wavelength ranges, designated $\lambda_1$, $\lambda_2$, $\lambda_3$, and $\lambda_4$, respectively. Emitters 81–84 can comprise LEDs, laser diodes, or any other suitable devices having sufficiently discrete bandwidths. By way of example, emitters 81–84 could be four LEDs that produce light centered at 730, 770, 810, and 865 nanometers, respectively. Light from emitters 81–84 is combined by optical combining means 86 to produce a composite input signal on fiber-optic cable 68. A small portion of the light on fiber-optic cable 68 is coupled by fiber-optic cable 88 to demultiplexer 90, to provide a level control loop for the emitters. In the level control loop, demultiplexer 90 detects the intensity of the light on fiber-optic cable 88 in each of the four wavelength ranges $\lambda_1$–$\lambda_4$, and provides appropriate control signals to emitters 81–84 to maintain a constant illumination intensity in each wavelength range.

It will be appreciated that source 62 could also comprise a single broadband emitter such as an incandescent bulb, rather than the plurality of discrete emitters. However, one advantage of using discrete emitters is that a time division multiplexed system can be used in which the discrete emitters are sequentially pulsed on and off, thereby permitting some simplification of the design of the remainder of the system, as further described below.

Sensor 64 comprises encoder 100, demultiplexer 102, and multiplexer 104. Typically, the encoder is coupled to a movable member whose position is to be sensed. More generally, sensor 64 can be constructed such that encoder 100 moves in response to the variation of any arbitrary measurand. In the illustrated example, the encoder includes three tracks 111, 112, and 113, the tracks being indicated in cross section in FIG. 6, i.e., the encoder 100 moves in a direction normal to the plane of the drawing. It is assumed that each track has an optical transmissivity that varies with position along the track.

Demultiplexer 102 receives the composite input signal on fiber-optic cable 68, and demultiplexes the composite input signal to produce demultiplexed input signals 121–123 and reference signal 124. Input signals 121–123 and reference signal 124 comprise portions (ideally all) of the light on fiber-optic cable 68 in wavelength ranges $\lambda_1$–$\lambda_4$, respectively. Input signals 121–123 fall on tracks 111–113, respectively. The sensor is constructed such that reference signal 124 either does not pass through encoder 100, or passes through a clear portion of encoder 100. Thus reference signal 124 is not modulated as a result of the movement of the encoder. Light transmitted by tracks 111–113 appears as modulated signals 131–133, respectively. Modulated signals 131–133 and reference signal 124 are combined by multiplexer 104 to produce an optical output signal on fiber-optic cable 70 that is transmitted to detector 66. In an alternate reflection embodiment, modulated signals 131–133 would comprise the signals reflected from the respective tracks.

Detector 66 comprises demultiplexer 140, photodetectors 141–144, and level discriminator 146. Demultiplexer 140 demultiplexes the optical output signal on fiber-optic cable 70, to produce demultiplexed signals 151–154 that correspond to modulated signals 131–133 and reference signal 124, respectively. Signals 151-154 are then converted by photodetectors 141-144 into corresponding electrical output signals 161-164. Electrical output signals 161-163 therefore represent the present transmissibility of each of tracks 111-113, while electrical output signal 164 represents the attenuation in the sensor and cables that is independent of encoder position. Level discriminator 146 normalizes each of electrical output signals 161-163 by reference signal 164, and assigns the normalized signals to one of N distinct values, where N may vary between tracks. Level discriminator 146 can thus be regarded as a modulo N detector for each track. The detected levels for tracks 111-113 are then converted into a measurand signal 166. The modulo N detection can be implemented by a series of comparators in an analog signal processing system, or by a look-up table in software in a digital signal processing system. In either case, the level (i.e. transmissivity, reflectivity, or other property) of each track is obtained as a number to the base N.

It will be appreciated that if source 62 operates in a time division multiplexed fashion, then demultiplexer 140 can be eliminated, and a single photodetector may be used. In addition, demultiplexer 90 is in principle only required if emitters 81-84 are operated in a continuous rather than in a pulsed mode. However, if demultiplexer 90 has the same optical characteristics as demultiplexer 102 in sensor 64, then the effects of LED wavelength shifts due to temperature variations will be reduced. The inclusion of demultiplexer 90, even when time division multiplexing is used, is therefore beneficial if LED operating temperature variations are anticipated.

The sensor system of FIG. 6 can readily be adapted to include fault detection features. Failure of any one of the emitters can be sensed by monitoring the level control loop in fiber-optic cable 88 or demultiplexer 90. In addition, if the minimum intensity of any modulated signal is such that a detectable signal is always incident on the detector, absence of a detectable signal will indicate an LED failure. The integrity of the optical fiber link can be sensed by monitoring the detected light at the reference wavelength. If the detected light falls below a predetermined level, failure or severe degradation of the link would be indicated.

Figure 7:
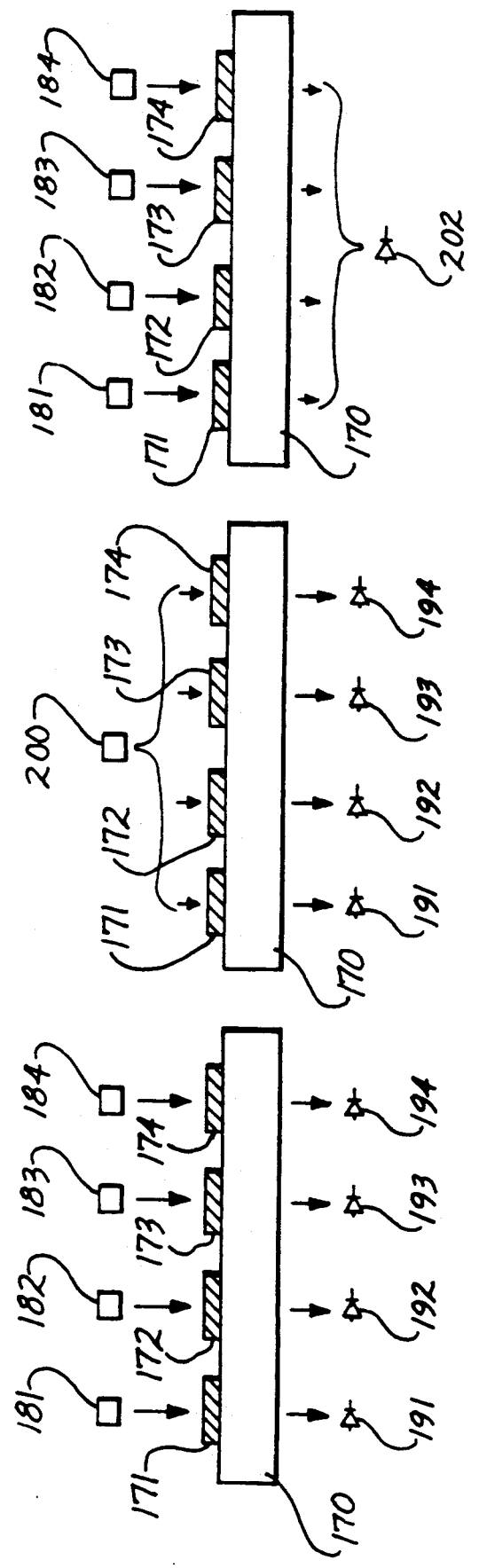
FIGS. 7A-7C are three diagrams showing alternate arrangements of emitters and detectors for optical embodiments of the invention.

In the embodiment shown in FIG. 6, a multicomponent input signal is transmitted to sensor 64 via fiber-optic cable 68, and is demultiplexed at the sensor. The modulated signals are then multiplexed at the sensor, and returned to detector 66 along another fiber-optic cable. FIGS. 7A-7C illustrate three alternative techniques. Referring initially to FIG. 7A, encoder 170 includes four illustrated tracks 171-174. Four discrete emitters 181-184 are positioned adjacent to the respective tracks, and four detectors 191-194 are positioned adjacent the respective tracks on the opposite side of encoder 170. Each of emitters 181-184 produces an optical input signal that passes through the adjacent track, and the resulting modulated signal emerging from the opposite side of encoder 170 is picked up by the respective detector. The electrical signals produced by the detectors can be transmitted to a level discriminator, such as level discriminator 146 shown in FIG. 6, for decoding to determine the encoder position.

In the embodiment shown in FIG. 7B, light from a single emitter 200 illuminates all four tracks 171-174, and the resulting modulated signals are picked up by detectors 191-194, as in the case of FIG. 7A. The signals produced by the detectors are then coupled to a level discriminator. The embodiment shown in FIG. 7C includes four discrete emitters 181-184, as in FIG. 7A, but only a single detector 202. In this case, emitters 181-184 are time-multiplexed, such that the electrical signal produced by detector 202 corresponds to a different track for each time slot. In each of the cases shown in FIGS. 7A-7C, a similar arrangement would apply to reflecting rather than transmitting tracks.

Figure 8:
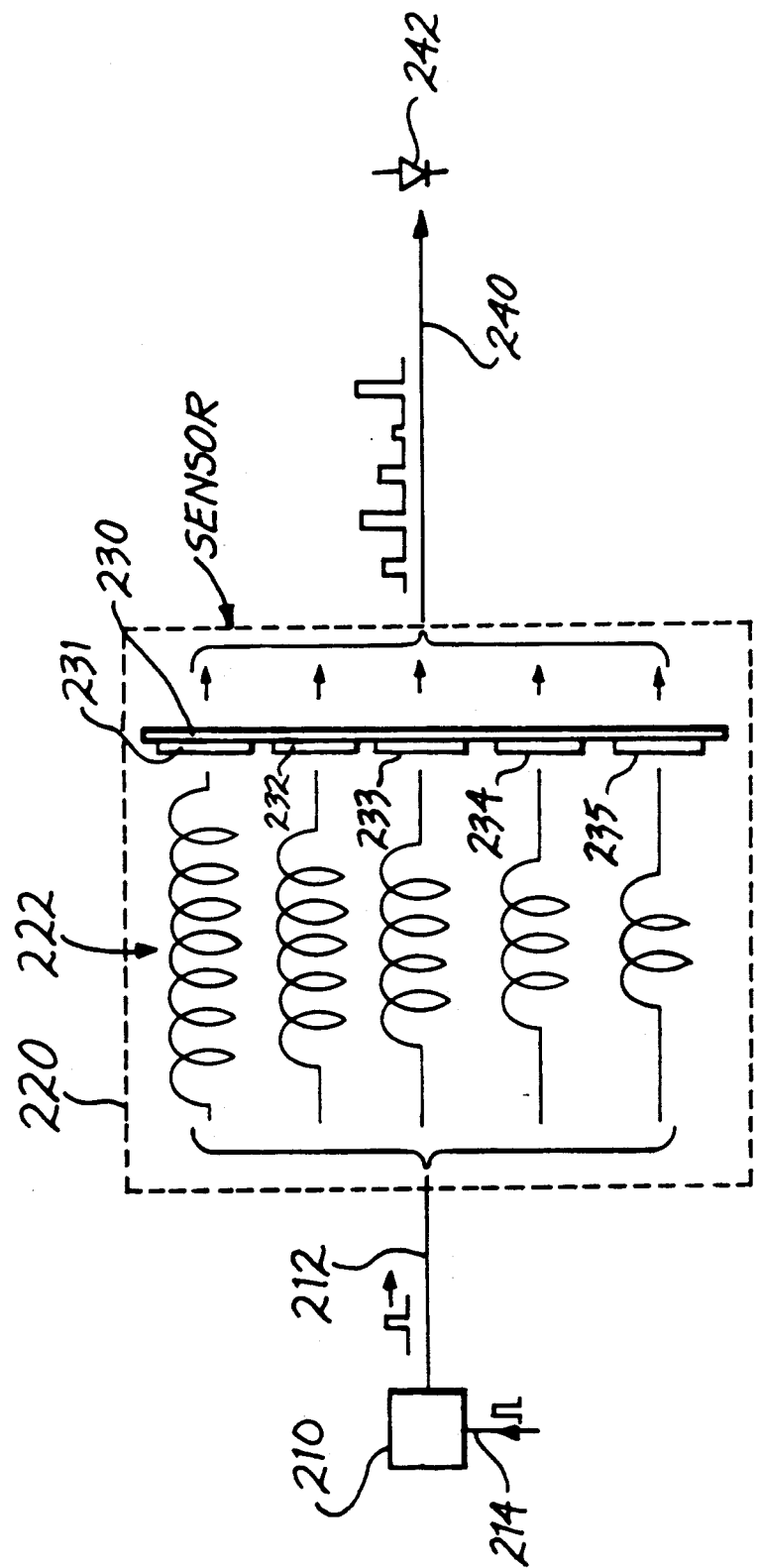
FIG. 8 is a schematic diagram of a time multiplexed transmissive sensor.

FIG. 8 illustrates an embodiment using a single emitter and a single detector. For this embodiment, the emitter comprises LED or laser diode 210 that outputs an optical pulse on fiber-optic cable 212 in response to a suitable modulation signal 214. The pulse on fiber-optic cable 212 is received by sensor 220, and introduced into a plurality of optical delay lines 222. The pulses exiting from the delay lines are directed onto tracks 231-235 of encoder 230, and the resulting modulated signals emerging from the encoder are combined onto a single fiber-optic return cable 240, and directed to detector 242. Each delay line produces a different time delay, and the resulting modulated pulses are therefore time-multiplexed on fiber-optic cable 240, thereby permitting the transmissivity of each track to be determined by examining the return signal in the corresponding time slot.

Figure 9:
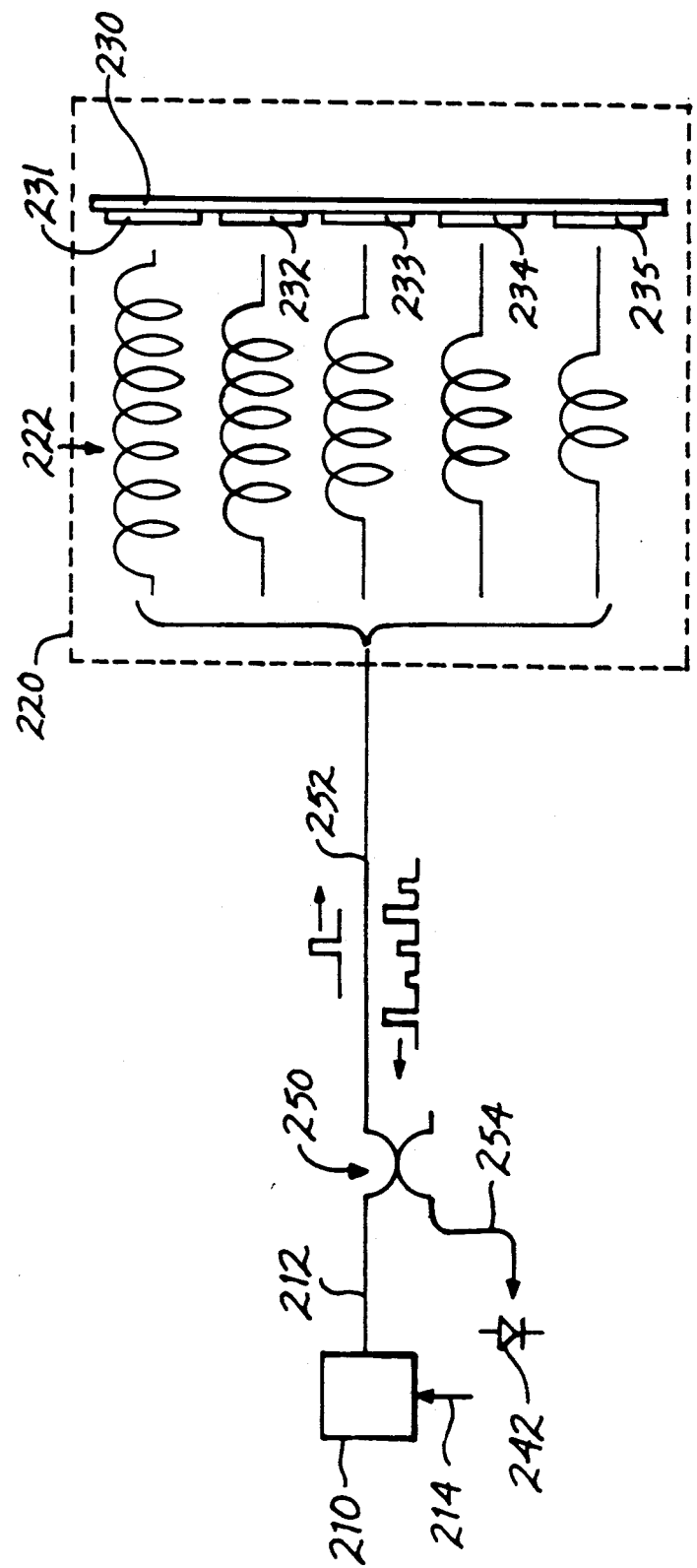
FIG. 9 is a schematic diagram of a time multiplexed reflective sensor.

FIG. 9 illustrates the reflection analog of the time division multiplexed system of FIG. 8. In FIG. 9, either encoder 230 and/or tracks 231-235 are reflective, such that the modulated pulses are reflected back through delay lines 222 into fiber-optic cable 252. The return signal then passes through coupler 250 into fiber-optic cable 254, and from there to detector 242.

Figure 10A:
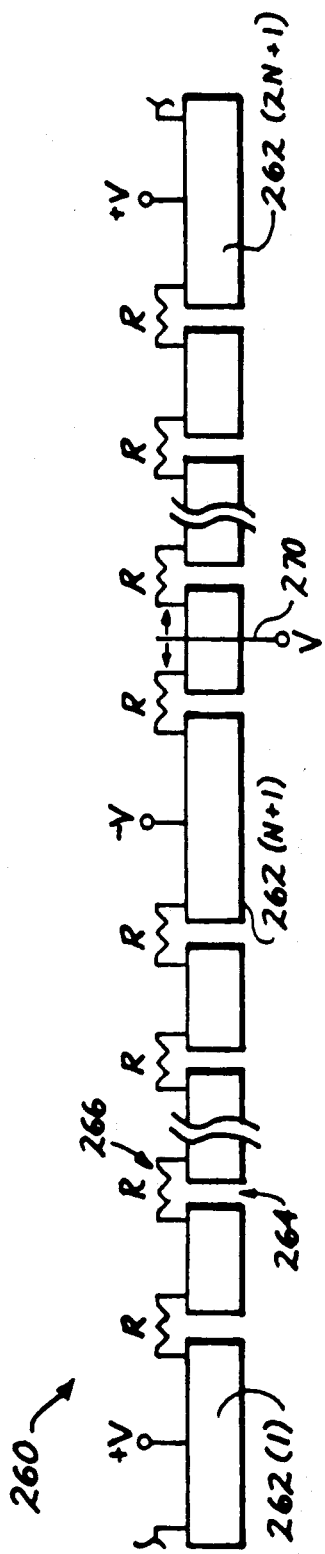
FIGS. 10A and 10B are schematic diagrams of stepwise and continuous electrical tracks according to the present invention.

The principles of the present invention can be applied to both optical and nonoptical encoders. FIGS. 10 and 11 illustrate the invention in the context of a variable voltage or resistance encoder. Referring initially to FIG. 10A, encoder track 260 comprises a linear array of electrically conducting segments 262, separated from one another by narrow gaps 264. Adjacent segments are interconnected to one another by resistance means 266. In the illustrated embodiment, each resistance means has the same resistance R. Segment 262(1) is connected to positive potential $+V$, segment 262(N+1) is connected to negative potential $-V$, segment 262(2N+1) is connected to positive potential $+V$, etc. As a result, moving along the track, the potential varies in a stepwise manner between $+V$ and $-V$. The potential at any point along the track is sensed by a wiper 270 that moves lengthwise with respect to the track (or vice versa) as the measurand of interest varies. A palindromic arrangement is provided, as in FIG. 3, such that the voltage levels are reflected about the maximum voltage segments, e.g., segments 262(1) and 262(2N+1), and about the minimum voltage segments, e.g., segment 262(N+1). This palindromic arrangement causes segments 262(1), 262(N+1), 262(2N+1), etc., to have twice the length of the other segments.

Figure 10B:
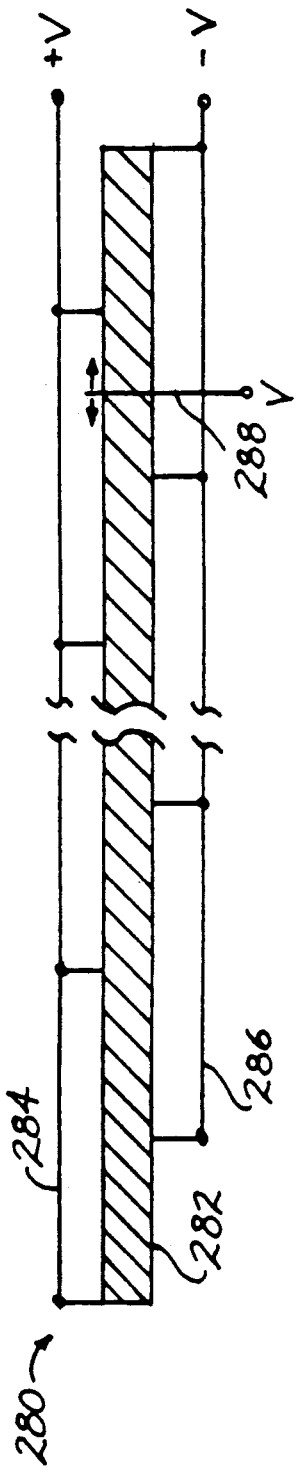
Figure 11:
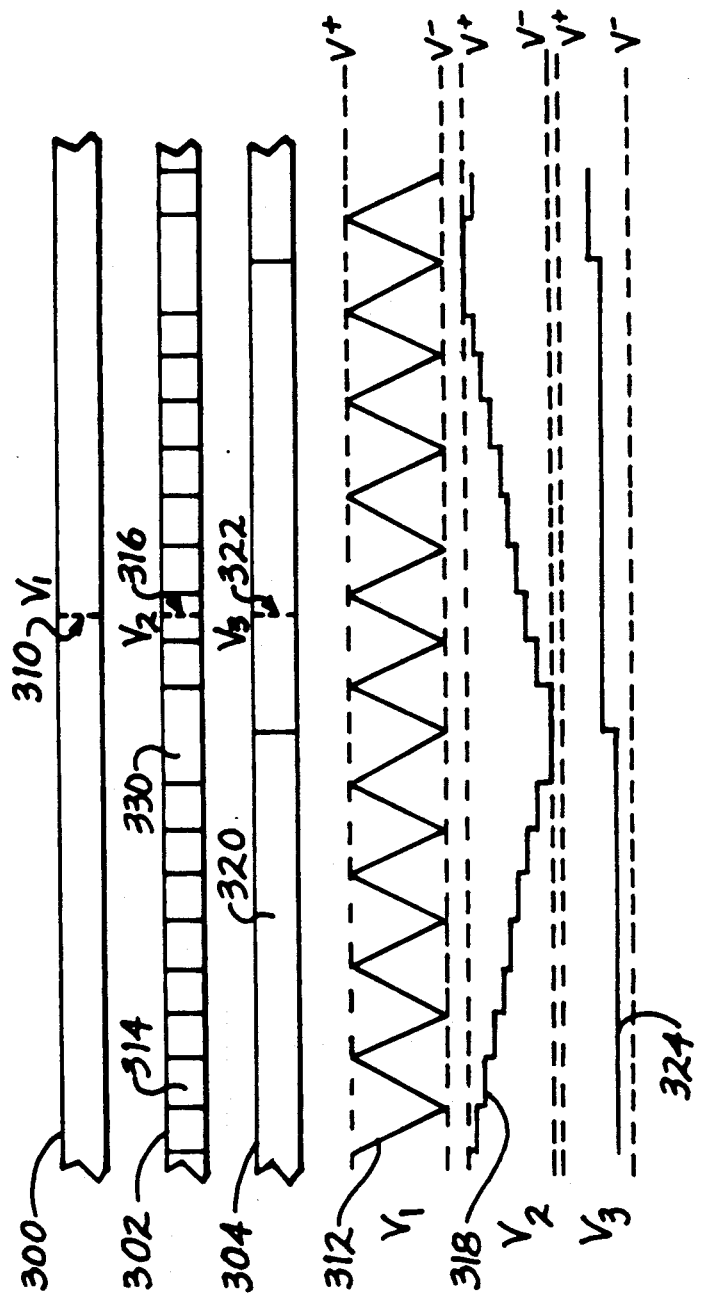
FIG. 11 is a schematic diagram showing a portion of an electrical encoder, and associated voltage waveforms.

FIG. 10B illustrates a continuously variable track 280 comprising a continuous resistive strip 282. A first conductor 284 held at a potential of $+V$ is periodically coupled to strip 282, and a second conductor 286 held at a potential of $-V$ is connected to strip 282 at the same spatial frequency, but offset by half a cycle. As a result, the potential V sensed by wiper 288 varies continuously in a sawtooth pattern between $+V$ and $-V$ as the wiper moves relative to the track.

FIG. 11 illustrates an encoder formed using tracks of the type shown in FIGS. 10A and 10B. In particular, the encoder of FIG. 11 comprises continuously variable track 300 and stepwise variable tracks 302 and 304. Track 300 is formed in a manner similar to that shown in FIG. 10B, and the potential $V_1$ picked off by wiper 310 along track 300 is illustrated by waveform 312. Track 302 is formed in a manner similar to that shown in FIG. 10A, and comprises a plurality of segments 314. The potential $V_2$ picked off by wiper 316 along track 302 is illustrated by waveform 318, i.e., a stepwise variation between segments. Track 304 is similar to track 302, except that its segments 320 are substantially longer, and the resulting potential $V_3$ picked off by wiper 322 is shown by waveform 324. The arrangement is palindromic, and essentially identical to that shown in FIGS. 3 and 4-5. Wipers 310, 316, and 322 move in unison lengthwise with respect to the tracks, and the set of voltages $V_1$, $V_2$, and $V_3$ thereby encode the relative positions of the wipers and tracks, in a manner essentially identical to that of the optical embodiments previously described.

While the preferred embodiments of the invention have been illustrated and described, variations will be apparent to those skilled in the art. Accordingly, the invention is not limited to the described embodiments, but is instead set forth in the following claims.

The embodiments of the invention in which an exclusive property or privilege is claimed are defined as follows:

1. A sensor, comprising:
   encoding means having a sensing axis and a plurality of tracks extending along the sensing axis, each track having a property that varies along the sensing axis such that said property can have one of three or more distinct property levels, the property level of each track varying in a stepwise manner along the sensing axis; and
   detection means for detecting the property levels of the tracks at detection positions and for producing output signals having output signal levels corresponding to said property levels at said detection positions, the arrangement of the property levels along each track being selected such that the output signal levels encode the relative position of the encoding means with respect to the detection positions at a plurality of relative positions along the sensing axis.

2. The sensor of claim 1, wherein for each track at all transitions along the track between a first and a second distinct property level, there are no other distinct property levels for the track between the first and the second distinct property levels.

3. The sensor of claim 1, wherein the encoding means includes first and second tracks, and wherein at each transition along the first track at which the property level of the first track changes, the property level of the second track does not change.

4. The sensor of claim 3, wherein for each of the first and second tracks, at all transitions along the track between a first and a second distinct property level, there are no other distinct property levels for the track between the first and second distinct property levels.

5. The sensor of claim 1 wherein the encoding means comprises a third track having a property level that varies in a continuous manner along the sensing axis.

6. The sensor of claim 1, wherein the detection means comprises illumination means for illuminating each track with an optical input signal, wherein each track modulates the intensity of its respective input signal to produce a modulated signal, and wherein the detection means comprises means for measuring the intensities of the modulated signals.

7. The sensor of claim 6, wherein for each track, said property is the transmissivity of the track.

8. The sensor of claim 6, wherein for each track, said property is the reflectivity of the track.

9. The sensor of claim 6, wherein the illumination means produces the input signals such that each input signal comprises light in a wavelength range different from the wavelength ranges of the other input signals.

10. The sensor of claim 6, wherein the detection means comprises delay means for delaying the input and/or modulated signals, such that the modulated signals are time multiplexed.

11. The sensor of claim 10, wherein the detection means comprises a single photodetector for converting all modulated signals into corresponding electrical signals.

12. The sensor of claim 6, wherein each input signal is produced by a separate optical emitter.

13. The sensor of claim 6, wherein all input signals are produced by a single optical emitter.

14. The sensor of claim 1, wherein for each track, said property is a voltage level and the detection means comprises a conductive wiper for contacting the track at the detection position.

* * * * *